(12) United States Patent
Graham et al.

(10) Patent No.: US 9,657,682 B2
(45) Date of Patent: May 23, 2017

(54) CYLINDER LINER ASSEMBLY HAVING A THERMAL BARRIER COATING

(71) Applicant: CATERPILLAR INC., Peoria, IL (US)

(72) Inventors: Curtis John Graham, Peoria, IL (US); Daniel Thomas Cavanaugh, Chillicothe, IL (US); Taylor Douglas Young, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 168 days.

(21) Appl. No.: 14/728,035

(22) Filed: Jun. 2, 2015

(65) Prior Publication Data

US 2016/0356239 A1    Dec. 8, 2016

(51) Int. Cl.
| | |
|---|---|
| F02B 19/00 | (2006.01) |
| F02F 1/10 | (2006.01) |
| F02B 75/08 | (2006.01) |
| F02F 1/00 | (2006.01) |
| C23C 4/06 | (2016.01) |
| C23C 14/14 | (2006.01) |
| C23C 24/04 | (2006.01) |

(52) U.S. Cl.
CPC ............... *F02F 1/004* (2013.01); *C23C 4/06* (2013.01); *C23C 14/14* (2013.01); *C23C 24/04* (2013.01)

(58) Field of Classification Search
CPC ...... F02F 1/004; F02F 1/02; F02F 7/00; F02F 11/005; F16J 10/00
USPC .......... 123/193.2, 270, 271, 41.84, 668, 669
See application file for complete search history.

(56) References Cited

U.S. PATENT DOCUMENTS

| | | | |
|---|---|---|---|
| 5,553,585 | A | 9/1996 | Paro |
| 5,916,390 | A | 6/1999 | Ruckert et al. |
| 6,732,699 | B2 | 5/2004 | Wakade et al. |
| 8,601,995 | B2 | 12/2013 | Worthington et al. |
| 2012/0304954 | A1 | 12/2012 | Kiser et al. |
| 2013/0055993 | A1 | 3/2013 | Kantola et al. |
| 2013/0340700 | A1 | 12/2013 | Donahue |

FOREIGN PATENT DOCUMENTS

| | | |
|---|---|---|
| CN | 202125365 | 6/2011 |
| JP | 01155061 | 12/1987 |
| JP | 2013148026 | 1/2012 |
| WO | WO 2014/019723 | 8/2012 |

*Primary Examiner* — Carlos A Rivera
*Assistant Examiner* — Syed O Hasan
(74) *Attorney, Agent, or Firm* — Finnegan, Henderson, Farabow, Garrett & Dunner, LLP

(57) ABSTRACT

A cylinder liner assembly is disclosed for use with an engine. The cylinder liner assembly may include a liner having a hollow generally cylindrical body extending from a top end to a bottom end along a longitudinal axis, and an internal annular cuff ring groove formed at the top end of the liner. An internal surface of the internal cuff ring groove may include a metal spray coating having a thermal conductivity that is less than a thermal conductivity of a base material of the liner to act as a thermal insulating layer. A cuff ring may be disposed within the internal cuff ring groove at the top end of the liner in contact with the metal spray coating. A seal may be disposed around an outer circumferential surface of the liner approximately in axial alignment with an internal axial end of the internal cuff ring groove.

15 Claims, 3 Drawing Sheets

CYLINDER LINER ASSEMBLY HAVING A THERMAL BARRIER COATING

TECHNICAL FIELD

The present disclosure relates generally to a cylinder liner assembly and, more particularly, to a cylinder liner assembly having a thermal barrier coating formed in a cuff ring groove of the cylinder liner assembly.

BACKGROUND

An internal combustion engine includes an engine block defining a plurality of cylinder bores, and pistons that reciprocate within the cylinder bores to generate mechanical power. Typically, each cylinder bore includes a replaceable liner. The liner has a cylindrical body that fits within the cylinder bore, and a radial flange at a top end of the body that supports the cylinder liner on the engine block. In some embodiments, a cavity is formed within the cylinder block around the liner, and coolant is directed through the cavity to cool the liner. A seal is placed around the liner and against the flange to inhibit coolant from leaking out of the cavity.

In some applications, a cuff ring is fitted into an upper end of the liner at the flange. The cuff ring has an inner diameter that is slightly smaller than an inner diameter of the liner, and functions to scrape carbon deposits off a top of the associated piston. The carbon deposits, if left intact could eventually rub against the liner, polishing away oil retaining grooves in the liner. An exemplary cuff ring is disclosed in U.S. Pat. No. 5,553,585 that issued to Paro on Sep. 10, 1996. Cuff rings are also referred to as "anti-polishing" rings as a result of their function to remove carbon deposits that may polish away oil retaining grooves in the liner.

Although a cuff ring may be effective at removing carbon buildup from a piston, it may also be possible for too much heat to pass through the ring and through the liner to the seal. In these situations, the seal could overheat and turn brittle or crack. When the integrity of the seal is compromised, coolant from the cavity below the seal may leak out of the engine block. This could cause overheating of the engine, contamination of other engine fluids (e.g., of engine oil), corrosion, and other similar problems.

The cylinder liner assembly of the present disclosure solves one or more of the problems set forth above and/or other problems in the art.

SUMMARY

In one aspect, the present disclosure is directed to a cylinder liner assembly. The cylinder liner assembly may include a liner having a hollow generally cylindrical body extending from a top end to a bottom end along a longitudinal axis, and an internal annular cuff ring groove formed at the top end of the liner. An internal surface of the cuff ring groove may include a metal spray coating having a thermal conductivity that is less than a thermal conductivity of a base material of the liner to act as a thermal insulating layer. A cuff ring may be disposed within the cuff ring groove at the top end of the liner in contact with the metal spray coating. A seal may be disposed around an outer circumferential surface of the liner approximately in axial alignment with an internal axial end of the cuff ring groove.

In another aspect, the present disclosure is directed to a method of producing a cylinder liner configured to be installed into a cylinder of an engine. The method may include forming the cylinder liner with a hollow cylindrical body extending along a longitudinal axis, and an annular flange protruding radially outward at a top axial end of the cylindrical body. The method may further include forming an internal annular recess at the top end of the cylindrical body, the annular recess being configured to extend axially into the top end of the cylindrical body from a top surface of the flange to an internal axial shoulder, and configured to receive a cuff ring within the annular recess. The method may still further include applying a coating over the internal annular recess by a metal spray process, and installing a cuff ring into the internal annular recess.

In yet another aspect, the present disclosure is directed to a method of applying a thermal barrier to a cylinder liner, wherein the cylinder liner comprises a hollow cylindrical body extending from a top end to a bottom end along a longitudinal axis, an internal annular recess formed at the top end, and a flange connected to the hollow cylindrical body at the top end for engagement with a cylinder block of an engine. The method of applying the thermal barrier may include metal spray coating at least a portion of the internal annular recess. The metal spray coating may include using a process selected from a group of spray processes consisting of low and high pressure cold spray processes, plasma spraying (air (APS), vacuum (VPS) and low pressure (LPPS)), high velocity air-fuel thermal spray processes, high velocity oxy-fuel (HVOF) thermal spray processes, physical vapor deposition processes, solution plasma spray processes, suspension plasma processes, flame spray processes, and electric arc spray processes.

DETAILED DESCRIPTION

Figure 1:
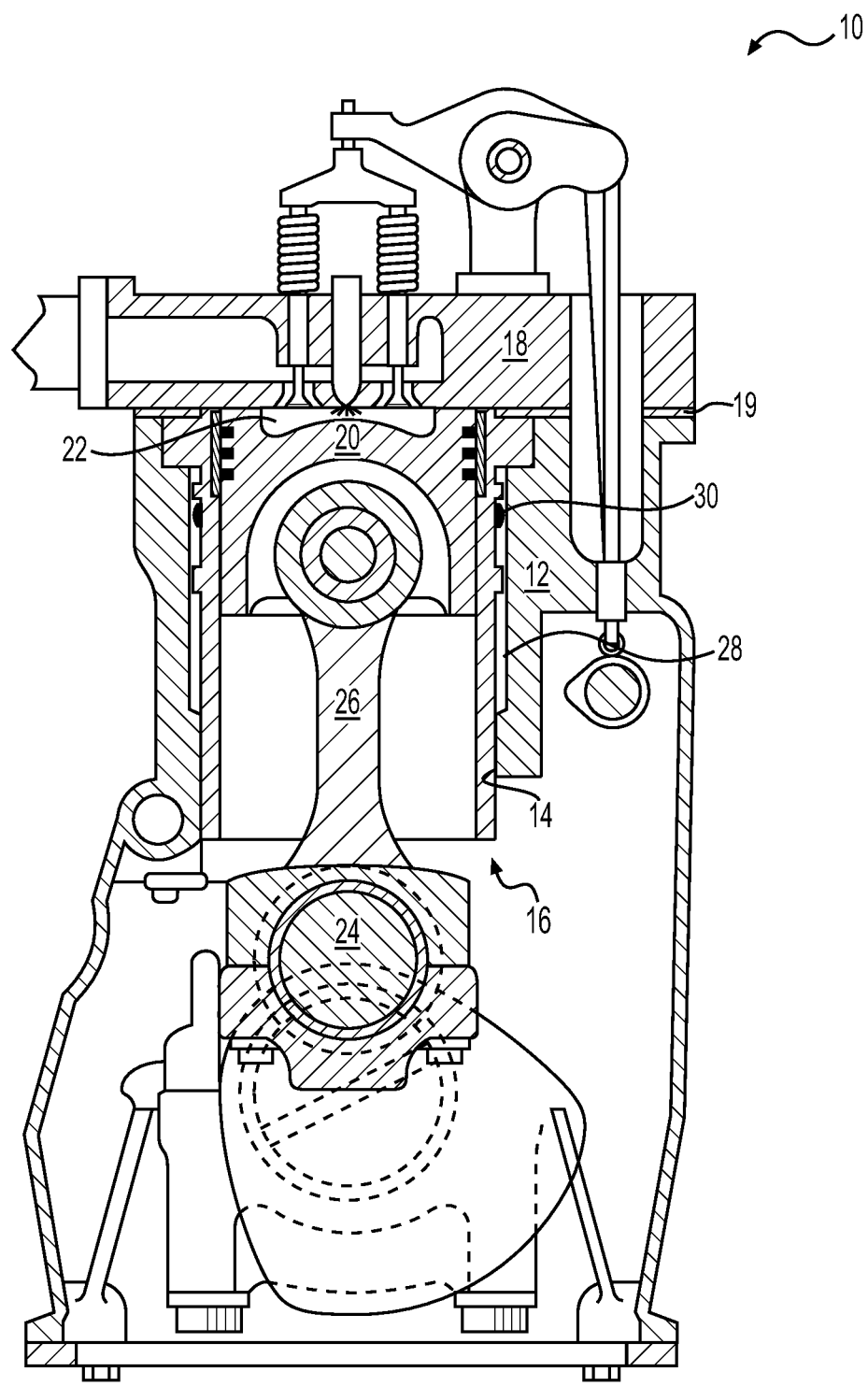
FIG. 1 is a cross-sectional illustration of an exemplary disclosed engine.

FIG. 1 illustrates a portion of an exemplary internal combustion engine 10. The internal combustion engine 10 may include an engine block 12 defining at least one cylinder bore 14. A cylinder liner assembly 16 may be disposed within the cylinder bore 14, and a cylinder head 18 may be connected to the engine block 12 to close off an end of the cylinder bore 14. A head gasket 19 may provide a seal between a lower, or fire deck surface of the cylinder head 18 and the engine block 12, and around a top end of each of the at least one cylinder bore 14. A piston 20 may be slidably disposed within the cylinder liner assembly 16, and the piston 20 together with the cylinder liner assembly 16 and the cylinder head 18 may define a combustion chamber 22. The engine 10 may include any number of combustion chambers 22 and the combustion chambers 22 may be disposed in an "in-line" configuration, in a "V" configuration, in an opposing-piston configuration, or in any other suitable configuration.

The piston 20 may be configured to reciprocate within the cylinder liner assembly 16 between a top-dead-center (TDC) position and a bottom-dead-center (BDC) position to facilitate a combustion process within the chamber 22. In particular, the piston 20 may be pivotally connected to a crankshaft 24 by way of a connecting rod 26, so that a sliding motion of each piston 20 within the cylinder liner assembly 16 results in a rotation of the crankshaft 24. Similarly, a rotation of the crankshaft 24 may result in a sliding motion of the piston 20. In a two-stroke engine, the piston 20 may move through two full strokes to complete a combustion cycle that includes a power/exhaust/intake stroke (TDC to BDC) and an intake/compression stroke (BDC to TDC). In a four-stroke engine, the piston 20 may move through four full strokes to complete a combustion cycle that includes an intake stroke (TDC to BDC), a compression stroke (BDC to TDC), a power stroke (TDC to BDC), and an exhaust stroke (BDC to TDC). Fuel (e.g., diesel fuel, gasoline, gaseous fuel, etc.) may be injected into the combustion chamber 22 during the intake strokes of either combustion cycle. The fuel may be mixed with air during the compression strokes and ignited. The heat and pressure resulting from the fuel/air ignition may then be converted to useful mechanical power during the ensuing power strokes. Residual gases may be discharged from the combustion chamber 22 during the exhaust strokes.

Heat from the combustion process described above that could damage the engine 10, if unaccounted for, may be dissipated from the cylinder bore 14 by way of a water jacket 28. The water jacket 28 may be located between an internal wall of the cylinder bore 14 and an external wall of the cylinder liner assembly 16. For example, the water jacket 28 may be formed by a recess within the engine block 12 at the internal wall of the cylinder bore 14 and/or within the external wall of the cylinder liner assembly 16. The water jacket 28 may be formed completely within the engine block 12 around the cylinder liner assembly 16, formed completely within the cylinder liner assembly 16, and/or formed by a hollow sleeve (not shown) that is brazed to either one of the engine block 12 or the cylinder liner assembly 16, as desired. Water, glycol, or a blended mixture may be directed through the water jacket 28 to absorb heat from the engine block 12 and the cylinder liner assembly 16.

A seal 30 may be disposed around the cylinder liner assembly 16 to seal off an upper end of the water jacket 28. The seal 30 may be sandwiched between an outer wall of the cylinder liner assembly 16 and an inner wall of the cylinder bore 14, after assembly, such that coolant within the water jacket 28 is inhibited from leaking out of the engine block 12 through a top of the cylinder bore 14. The seal 30 may be, for example, an o-ring type seal fabricated from a resilient material.

Figure 2:
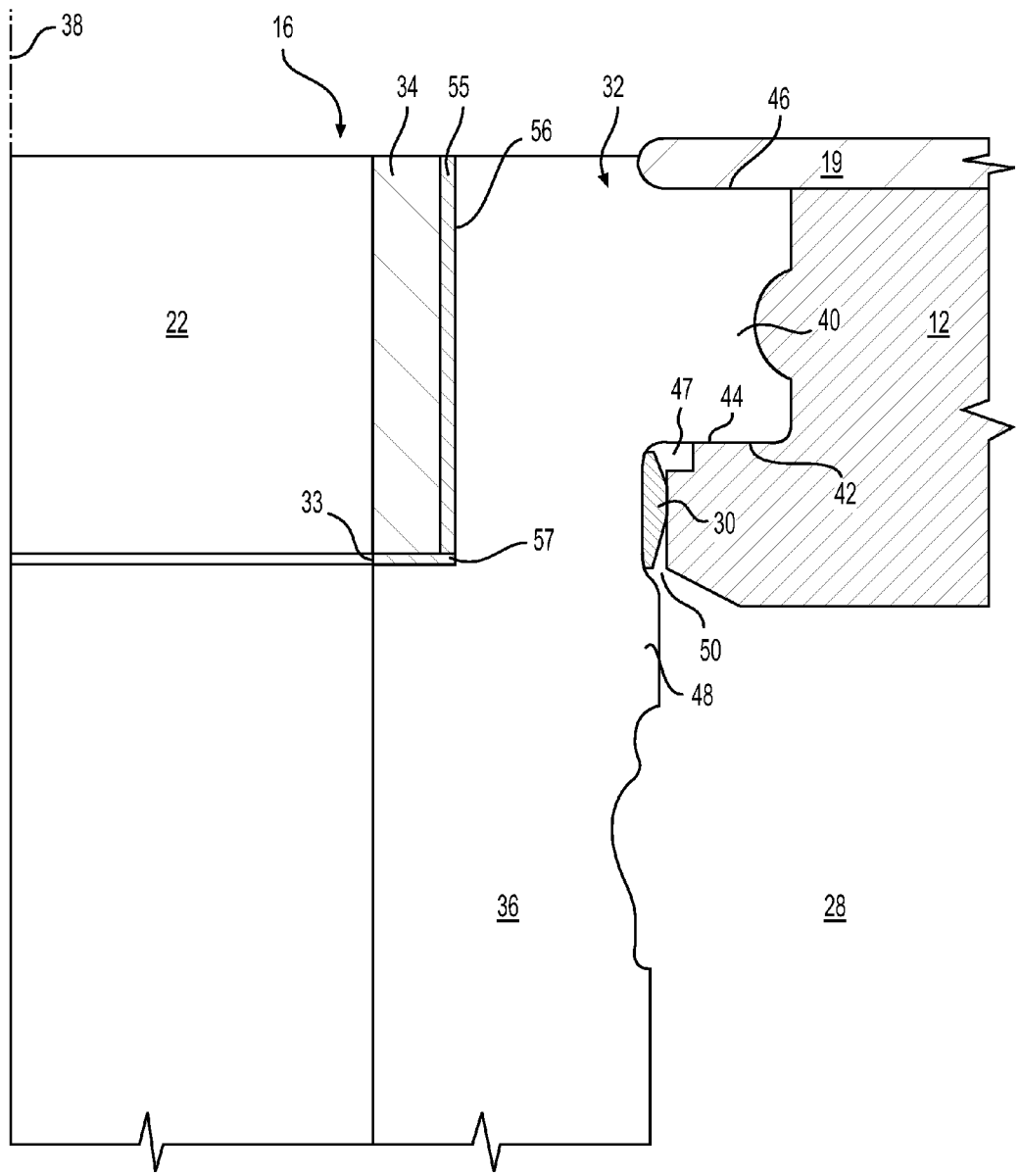
FIG. 2 is a cross-sectional illustration of an exemplary disclosed cylinder liner assembly that may be used in conjunction with the engine of FIG. 1.
Figure 3:
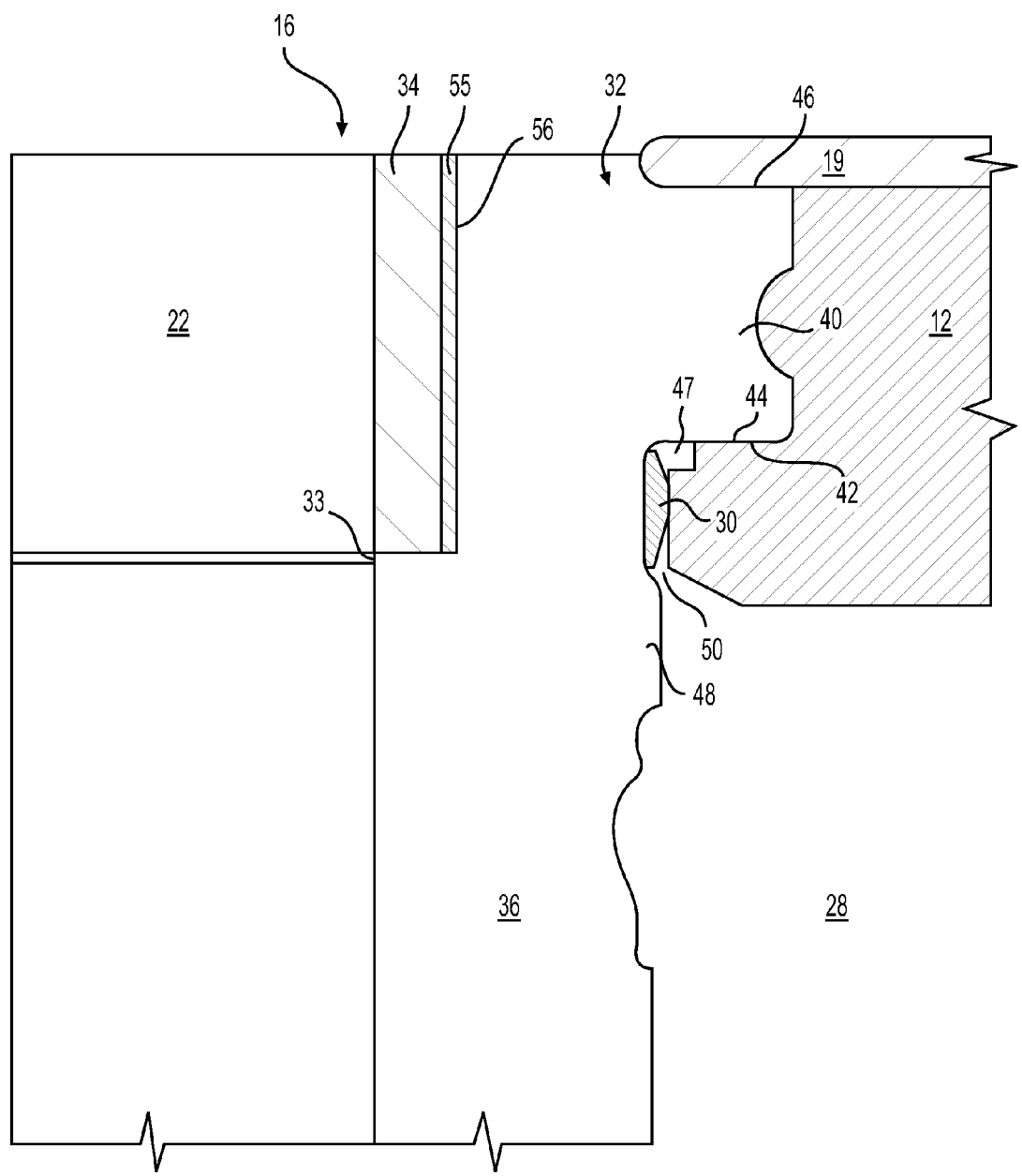
FIG. 3 is a cross-sectional illustration of another exemplary disclosed cylinder liner assembly that may be used in conjunction with the engine of FIG. 1.

As shown in FIGS. 2 and 3, the cylinder liner assembly 16 may be an assembly of at least two main components, including a cylinder liner ("liner") 32 and a cuff ring or anti-polishing ring ("ring") 34, together with the seal 30. Each of the liner 32 and the ring 34 may be made of the same general material, for example from an alloyed gray iron. The ring 34 may be fitted into an upper or external end of the liner 32 prior to assembly of the cylinder liner assembly 16 into the cylinder bore 14 of the engine block 12. In this position, the ring 34 may be configured to receive a top land of the piston 20 (referring to FIG. 1). In particular, the top end of the piston 20 may slide into the ring 34 a distance during each upward stroke that allows the ring 34 to scrape away any carbon deposits that have built up on the outer annular surface of the piston 20 at a location above any associated piston rings. By scraping away the carbon deposits, the life of engine 10 may be extended.

The liner 32 may have a hollow generally cylindrical body 36 extending along a longitudinal axis 38, and an annular flange 40 protruding radially outward at a top or exposed end of the body 36. A lower face 42 of the flange 40 may be configured to engage an upper face 44 of the engine block 12, while an upper face 46 of the flange 40 may be configured to engage the head gasket 19. An annular recess or groove 47 may be formed under the flange 40 (i.e., at an inside corner of the body 36 and the flange 40 of the liner 32) to function as an overflow or backup coolant collection cavity. In particular, any coolant that leaks from the water jacket 28 past the seal 30 may be collected within the recess 47, and the engagement of the lower face 42 with the upper face 44 may inhibit this collected coolant from escaping the recess 47.

The seal 30 may be retained at a desired axial location on the liner 32 (e.g., approximately in axial alignment with an inner axial end of the ring 34) by one or more end stops 48 located at one or more opposing sides of the seal 30. In the exemplary embodiment shown in FIGS. 2 and 3, the seal 30 may be retained approximately in axial alignment with the inner axial end of the ring 34, and between the lower face 42 of the flange 40 and the end stop 48 formed on the outer circumferential surface of the liner 32. "Approximately" in axial alignment, as used herein, encompasses variations in the location of the seal 30 that account for normal manufacturing tolerances and assembly tolerances during the manufacture of the cylinder liner 32 and assembly of the cylinder liner assembly 16 in a cylinder bore 14 in the engine block 12. The water jacket 28 may fluidly communicate with a lower half of the seal 30 via an annular passage 50 formed by a difference of liner and bore diameters at an axial location adjacent the end stop 48. This communication through the annular passage 50 may help to cool the seal 30.

An internal annular recess, or cuff ring groove 56 may be formed at the top end of the body 36 of the cylinder liner 32 and configured to receive the cuff ring 34. The cuff ring groove 56 may extend into the top end of the liner 32 from a top surface of the flange 40 to an inner axial shoulder 33. A radial thickness of the cuff ring 34 between its radially outer circumferential surface and radially inner circumferential surface may be slightly greater than the radial width of the inner axial shoulder 33 of the cuff ring groove 56. As a result, when the ring 34 is fitted into the cuff ring groove 56, the internal diameter of the ring 34 may be less than the internal diameter of the body 36 of the cylinder liner 32. With this configuration, a step may be created between the bottom of the cuff ring 34 and the internal diameter of the ring 34. This step may interact with a top end of the piston 20 as the piston approaches TDC to scrape away the carbon buildup described above.

Heat generated during the combustion process in combustion chamber 22 may be conducted radially outward through the upper portion of the liner 32 between an inner axial end of the cuff ring 34 and the seal 30. This upper liner seal area may be particularly susceptible to large amounts of heat transfer because of the high temperatures experienced by the cuff ring 34 during the combustion process. High temperatures are generated during each explosion of a fuel/air mixture in the combustion chamber 22 when the piston 20 is near TDC at the beginning of each power stroke. As a result, a large temperature difference may exist between the inner axial end of the cuff ring 34 and the outer circumferential surface of the ring 32 in the vicinity of the recess 47, the seal 30, and the annular passage 50. The temperature differences between the inner and outer circumferential surfaces of the ring 32 may be especially pronounced in regions such as the upper liner seal area, because of the cooler areas on the outer circumferential surfaces of the ring 32 in contact with coolant. These large temperature gradients may result in conductive heat transfer through the liner in the vicinity of the seal 30 that may expose the seal 30 to high temperatures and cause a detrimental decrease in the life of the seal 30.

As shown in FIG. 2, a thermal barrier coating 55 may be formed on the inner circumferential surface of the cuff ring groove 56, and a thermal barrier coating 57 may be formed on the inner axial shoulder 33. In an alternative implementation shown in FIG. 3, the thermal barrier coating 55 may be formed on the inner circumferential surface of the cuff ring groove 56, and the inner axial shoulder 33 may be free of any coating. The thermal barrier coatings 55, 57 may be formed by spraying a material onto the surfaces of the cuff ring groove that come into contact with the cuff ring 34, thereby functioning to reduce the amount of conductive heat transfer through the cylinder liner 32 in the upper liner seal area between the cuff ring 34 and the seal 30. Various embodiments may include the thermal barrier coatings having thermal conductivity that is within the range from approximately 10% to 90% of the thermal conductivity of the base material of the cylinder liner 32.

Methods for producing the cylinder liner 32, and for applying the thermal barrier coatings 55, 57 to surfaces of the cuff ring groove 56 are discussed in the following section.

INDUSTRIAL APPLICABILITY

The disclosed cylinder liner assembly 16 may be used in any application where it is desired to increase the reliability and operating life of the associated engine. The disclosed cylinder liner assembly may increase reliability and operating life by lowering a temperature experienced by the seal 30 installed on the cylinder liner 32 of the assembly 16. The temperature at the seal 30 may be lowered through the use of a thermal barrier coating applied at an interface between the cylinder liner 32 and the associated cuff ring 34. The thermal barrier coating 55, 57 may be applied to the inner circumferential surface and inner axial shoulder of the cuff ring groove 56 formed at the top end of the cylinder liner 32. The cuff ring 34 may then be fitted in the cuff ring groove 56, and the seal 30 may be installed around the outer circumference of the liner below the lower face 42 of the flange 40 and above the end stop 48 formed on the outer circumference of the liner 32. The cylinder liner assembly 16 may then be installed into a cylinder bore 14 with the flange 40 of the liner 32 engaging with the upper face 44 of the engine block 12 to help position the liner in the cylinder bore 14. The head gasket 19 may provide a seal between the top surface 46 of the flange 40 and the lower surface (or "fire deck") of the cylinder head 18.

Application of the thermal barrier coatings 55, 57 to the inner circumferential surface and inner axial shoulder 33 of the cuff ring groove 56 may include depositing the coatings by a thermal spray technique, for example, plasma spraying (air (APS), vacuum (VPS) and low pressure (LPPS)), high velocity air-fuel thermal spray processes, or high velocity oxy-fuel (HVOF) thermal spray processes. Thermal spraying involves propelling molten or at least heat-softened particles of a heat fusible material (e.g., a metal alloy) against a surface, where the particles are quenched and bond to the surface to produce a coating. The thermal barrier coatings 55, 57 may be deposited in the form of molten "splats," resulting in a microstructure characterized by horizontal porosity resulting from the presence of the splats (flattened grains). The thermal barrier coatings may be deposited using other deposition processes, examples of which may include low and high pressure cold spray processes, physical vapor deposition processes, solution plasma spray processes, suspension plasma processes, flame spray processes, and electric arc spray processes.

Various coating application parameters may be controlled during the coating process in order to generate a thermal barrier located between the cuff ring 56 and the seal 30 in the upper liner seal area of the cylinder liner assembly 16. The coating application parameters may be controlled in order to produce thermal barrier coatings that significantly reduce the amount of conductive heat transfer through the liner in comparison to a liner without the coatings. The coating application parameters may be controlled in order to result in a coating of a material that will have increased phonon scattering, and therefore lower thermal conductivity relative to the constituent material of the coating, and relative to the liner material. The quantum of heat energy associated with an elementary excitation of the crystal lattice structure of a metal is called a phonon. A phonon is often referred to as a quasi-particle. In a material with a higher thermal conductivity, phonons travel through the lattice structure of the material with smaller amounts of scatter than in materials with lower thermal conductivity, such as insulating materials. A thermal spray coating of a material may have significantly lower thermal conductivity than the constituent material of the coating. This is because the particles of the material deposited as a thermal spray coating produce more phonon scattering than the constituent material, and therefore a greater resistance to thermal conduction of heat energy through the coating. As a result, a thermal spray coating made from the same constituent material as the base material of the substrate on which the coating is applied may have a lower thermal conductivity than the thermal conductivity of the substrate.

Parameters of the thermal spray coating process that may be varied in order to obtain a thermal barrier coating with lower thermal conductivity may include the standoff distance, or distance between the spray nozzle and the surface being coated, and the air pressure of air used to propel the molten coating material being applied to the surface. Other coating application parameters may include the amount of electric current being used to melt the wire or powder feedstock for the coating material, the angle between the direction of spray and the surface, the temperature, the humidity, and the transverse speed at which the spray nozzle is moved relative to the surface during application of the coating. Control of these and other thermal spray coating parameters may result in changes to the microstructure of the coating, including the porosity of the coating and the amount of oxides formed on the particles of the coating. The changes to the microstructure of the coating may contribute to an increase in phonon scattering during heat conduction through the coating, and therefore a decrease in the thermal conductivity of the part that has been coated vs. the same part without the thermal barrier coating.

The types of materials used to produce the thermal barrier coatings 55, 57 on the inner circumferential surface and inner axial shoulder of the cuff ring groove 56 in the cylinder liner 32 may include various metal alloys. In some alternative implementations, the feedstock material for the thermal barrier coatings may be the same as the material of the cylinder liner. In other implementations, the coating materials may include nickel alloys, nickel-aluminum alloys, iron-chromium-aluminum alloys, aluminum alloys with high silicon content, aluminum and bronze alloys, stainless steel, and carbon steel. The coating materials may be provided as feedstock in the form of wires or powders, and may be thermal sprayed using any of the thermal spray coating processes discussed above.

It will be apparent to those skilled in the art that various modifications and variations can be made to the disclosed cylinder liner assembly and methods of applying thermal barrier coatings to the liner. Other embodiments will be apparent to those skilled in the art from consideration of the specification and practice of the disclosed methods. It is intended that the specification and examples be considered as exemplary only, with a true scope being indicated by the following claims and their equivalents.

What is claimed is:

1. A cylinder liner assembly, comprising: a liner having a hollow generally cylindrical body extending from a top end to a bottom end along a longitudinal axis, and an internal annular cuff ring groove formed at the top end of the liner; an internal surface of the cuff ring groove including a metal spray coating having a thermal conductivity that is less than a thermal conductivity of a base material of the liner to act as a thermal insulating layer, the metal spray coating being applied on an inner circumferential surface of the cuff ring groove and a portion of an axial shoulder at an internal axial end of the cuff ring groove; a cuff ring disposed within the cuff ring groove at the top end of the liner in contact with the metal spray coating; and a seal for a water jacket disposed around an outer circumferential surface of the liner approximately in axial alignment with an internal axial end of the cuff ring groove.

2. The cylinder liner assembly of claim 1, wherein the metal spray coating is applied on an internal circumferential surface of the internal annular cuff ring groove.

3. The cylinder liner assembly of claim 1, wherein the metal spray coating has a thermal conductivity that is at least 10% less than the thermal conductivity of the base material of the liner.

4. The cylinder liner assembly of claim 1, wherein the metal spray coating has a thermal conductivity that is between approximately 10% and 90% of the thermal conductivity of the base material of the liner.

5. The cylinder liner assembly of claim 1, wherein the metal spray coating is made from a material selected from a group consisting of iron-chromium-aluminum alloys, aluminum alloys, aluminum alloys with high silicon content, aluminum-bronze alloys, stainless steel alloys, nickel alloys, nickel-aluminum alloys, and carbon steel alloys.

6. The cylinder liner assembly of claim 1, wherein the metal spray coating is applied using a process selected from a group of processes consisting of low and high pressure cold spray processes, plasma spraying (air (APS), vacuum (VPS) and low pressure (LPPS)), high velocity air-fuel thermal spray processes, high velocity oxy-fuel (HVOF) thermal spray processes, physical vapor deposition processes, solution plasma spray processes, suspension plasma processes, flame spray processes, and electric arc spray processes.

7. The cylinder liner assembly of claim 6, wherein the metal spray coating is made from a material selected from a group consisting of nickel alloys, nickel-aluminum alloys, iron-chromium-aluminum alloys, aluminum alloys, aluminum alloys with high silicon content, aluminum-bronze alloys, stainless steel alloys, and carbon steel alloys.

8. The cylinder liner assembly of claim 7, wherein feedstock material for the metal spray coating is provided as a powder.

9. A method of producing a cylinder liner configured to be installed into a cylinder of an engine, the method comprising: forming the cylinder liner with a hollow cylindrical body extending along a longitudinal axis, and an annular flange protruding radially outward at a top axial end of the cylindrical body; forming an internal annular recess at the top end of the cylindrical body, the annular recess being configured to extend axially into the top end of the cylindrical body from a top surface of the flange to an internal axial shoulder, and configured to receive a cuff ring within the annular recess; a seal for a water jacket disposed around an outer circumferential surface of the liner approximately in axial alignment with the internal axial shoulder of the internal annular recess; applying a coating over the internal annular recess by a metal spray process, the metal spray coating being applied on at least one of an inner circumferential surface of the internal annular recess and a portion of the internal axial shoulder; and installing a cuff ring into the internal annular recess.

10. The method of claim 9, further including applying a coating over the internal annular recess using a process selected from a group of processes consisting of low and high pressure cold spray processes, plasma spraying (air (APS), vacuum (VPS) and low pressure (LPPS)), high velocity air-fuel thermal spray processes, high velocity oxy-fuel (HVOF) thermal spray processes, physical vapor deposition processes, solution plasma spray processes, suspension plasma processes, flame spray processes, and electric arc spray processes.

11. The method of claim 10, wherein the metal spray coating is made from a material selected from a group consisting of iron-chromium-aluminum alloys, aluminum alloys, aluminum alloys with high silicon content, aluminum-bronze alloys, stainless steel alloys, nickel alloys, nickel-aluminum alloys, and carbon steel alloys.

12. The method of claim 11, wherein feedstock material for the metal spray coating is provided as one of a wire or a powder.

13. A method of applying a thermal barrier to a cylinder liner, wherein the cylinder liner comprises a hollow cylindrical body extending from a top end to a bottom end along a longitudinal axis, an internal annular recess formed at the top end, and a flange connected to the hollow cylindrical body at the top end for engagement with a cylinder block of an engine, the method comprising: applying a metal spray coating on at least one of an internal circumferential surface of the internal annular recess and a portion of an axial shoulder at an internal axial end of the internal annular recess, a seal for a water jacket disposed around an outer circumferential surface of the liner approximately in axial alignment with the axial shoulder at the internal axial end of the internal annular recess; the metal spray coating using a process selected from a group of spray processes consisting of low and high pressure cold spray processes, plasma spraying (air (APS), vacuum (VPS) and low pressure (LPPS)), high velocity air-fuel thermal spray processes, high velocity oxy-fuel (HVOF) thermal spray processes, physical vapor deposition processes, solution plasma spray processes, suspension plasma processes, flame spray processes, and electric arc spray processes.

14. The method of claim 13, wherein the metal spray coating is applied in order to result in a thermal conductivity of the coating that is between approximately 10% and 90% of the thermal conductivity of the liner material.

15. The method of claim 13, wherein the metal spray coating is applied using a spray process including controlling at least one of a standoff distance between a spray nozzle and the internal annular recess, an air pressure used to propel molten coating material from the spray nozzle, an amount of electric current used to melt wire or powder feedstock for the coating material, an angle between a direction of spray and a surface of the internal annular recess, a temperature, a humidity, and a transverse speed at which the spray nozzle is moved relative to the surface of the internal annular recess during application of the coating.

* * * * *